United States Patent
Schor

(10) Patent No.: US 10,502,800 B2
(45) Date of Patent: Dec. 10, 2019

(54) COMPUTER-SUPPORTED METHOD FOR PROCESSING AN EXAMINATION STEP

(71) Applicant: Siemens Healthcare GmbH, Erlangen (DE)

(72) Inventor: Stefan Schor, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 208 days.

(21) Appl. No.: 15/585,297

(22) Filed: May 3, 2017

(65) Prior Publication Data

US 2017/0322277 A1 Nov. 9, 2017

(30) Foreign Application Priority Data

May 3, 2016 (DE) .......................... 10 2016 207645

(51) Int. Cl.
*G01V 3/00* (2006.01)
*G01R 33/54* (2006.01)

(52) U.S. Cl.
CPC ................... *G01R 33/543* (2013.01)

(58) Field of Classification Search
USPC ........................................................ 324/309
See application file for complete search history.

(56) References Cited

U.S. PATENT DOCUMENTS

| | | | |
|---|---|---|---|
| 6,272,481 B1 * | 8/2001 | Lawrence | G06N 5/025 706/45 |
| 7,254,623 B1 | 8/2007 | Toth | |
| 7,315,755 B2 * | 1/2008 | Tsunoda | G06F 19/321 128/920 |
| 7,542,792 B2 * | 6/2009 | Wollenweber | A61B 6/032 250/370.08 |
| 9,275,189 B2 * | 3/2016 | Walker | A61B 6/032 |
| 9,649,079 B1 * | 5/2017 | Guntzer | A61B 6/5217 |
| 9,681,850 B2 * | 6/2017 | Park | A61B 6/542 |
| 2004/0148403 A1 * | 7/2004 | Choubey | G06F 19/325 709/228 |
| 2008/0130972 A1 * | 6/2008 | Miller | G06F 19/321 382/131 |
| 2010/0094700 A1 * | 4/2010 | Kuth | G06F 9/44505 705/14.25 |
| 2013/0265044 A1 | 10/2013 | Senegas et al. | |
| 2014/0303484 A1 * | 10/2014 | Krishnakumar | A61N 7/02 600/411 |
| 2016/0283659 A1 * | 9/2016 | Grodzki | G16H 50/70 |
| 2018/0128890 A1 * | 5/2018 | Schor | G01R 33/543 |

* cited by examiner

*Primary Examiner* — Rodney E Fuller
(74) *Attorney, Agent, or Firm* — Schiff Hardin LLP

(57) ABSTRACT

In a computer-supported method for processing an examination step, which includes parameters that can be set for imaging with a magnetic resonance apparatus, permitted ranges of values of the parameters are defined by a configuration of the magnetic resonance apparatus, and the configuration is described by a configuration file. An editor is functionally connected to the processor that performs a selection step. The selection step will be supplied with different configuration files, which describe different configurations of magnetic resonance apparatuses. After a selection made by a user from the different configuration files, this file will be supplied as the selected configuration file to the editor.

6 Claims, 2 Drawing Sheets

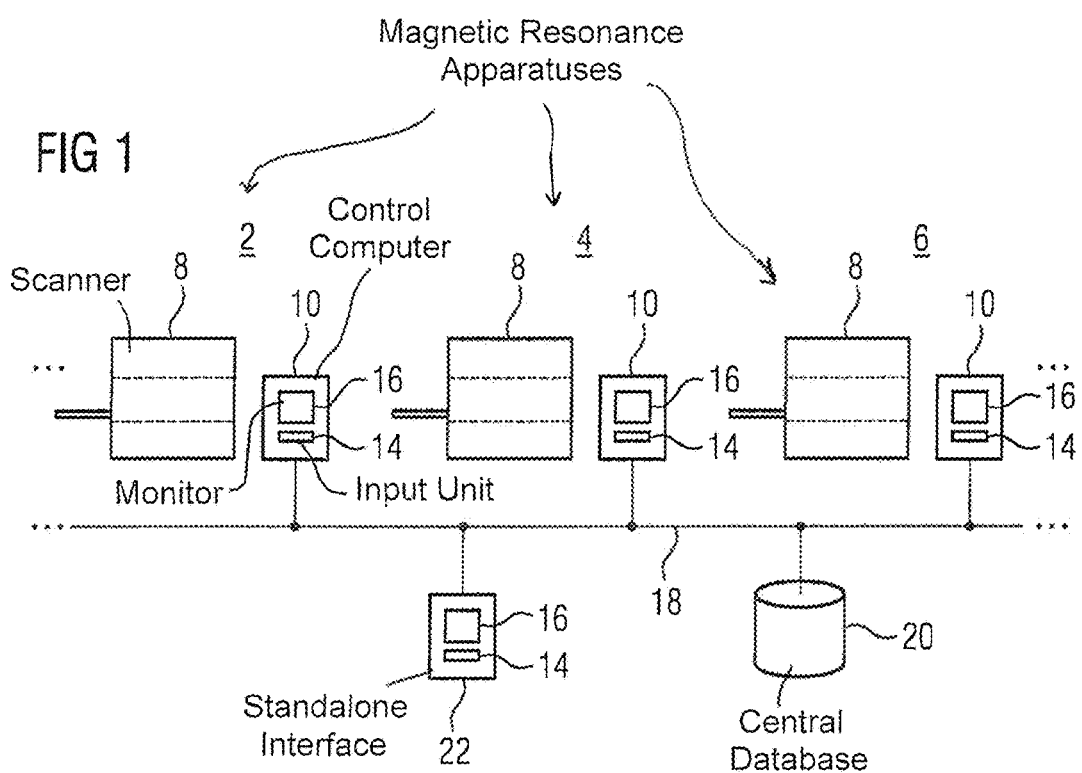

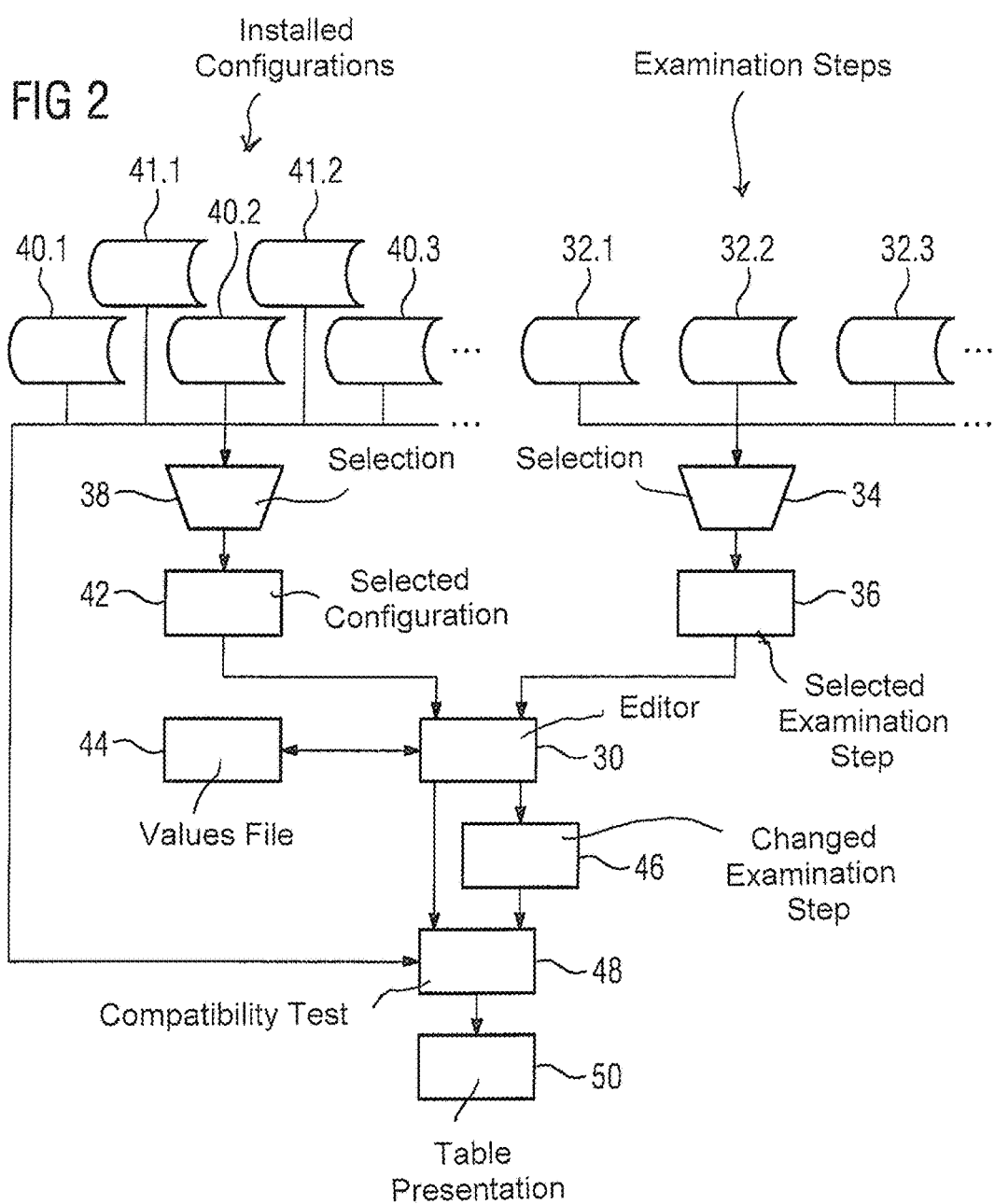

COMPUTER-SUPPORTED METHOD FOR PROCESSING AN EXAMINATION STEP

BACKGROUND OF THE INVENTION

Field of the Invention

The present invention concerns a computer-supported method for processing an examination step with a processor designed as an editor, wherein the examination step includes parameters that can be set for imaging with a magnetic resonance apparatus, wherein permitted ranges of values of the parameters are defined by a configuration of the magnetic resonance apparatus and wherein the configuration is described by a configuration file.

Description of the Prior Art

The current trend in healthcare is moving toward ever more examinations being carried out in large diagnostics centers or in chains of diagnostics centers with many diagnostic devices of similar types, i.e. including magnetic resonance apparatuses. Even in the diagnostics centers, respective magnetic resonance apparatuses often have an individual configuration, i.e. one or more magnetic resonance apparatuses has different equipment and component assemblies than other such apparatuses. As well as the basic magnetic field strength, the magnetic resonance apparatuses can differ, for example, in their built-in gradient system, their number of radio-frequency reception channels, the equipment that they have for special applications, such as spectroscopy, parallel imaging or PAT (Parallel Acquisition Technique) imaging, etc. Despite this array, there are still configurations that are very similar to one another.

The imaging performed with a medical magnetic resonance apparatus will be influenced by a number of parameters. Depending on the region of the body, the imaging characteristic of the region, the time available for the imaging, the medical problem, etc., there are appropriate imaging programs with examination steps that have proven suitable in the practice of imaging. The examination steps will be defined by specific values of the parameters influencing the imaging. The totality of the values of the parameters of an examination step can be stored as a respective parameter set in a database, so that these parameters can be used again. A parameter set for imaging a region of the body for a specific medical problem can involve several hundred individual parameters, which in some cases can have a mutual influence on each other to a considerable extent.

The number of parameters that can be set for a particular magnetic resonance imaging examination will frequently be used by operators in order to change and to optimize the values of the parameters needed for the examination to be conducted, with the goal of achieving the highest possible imaging quality.

In the diagnostics centers and diagnostics chains imaging programs configured for magnetic resonance imaging, which are proven and released, will often be stored in a central database. All magnetic resonance apparatuses or their users have access to this database. In order to reduce the effort for the maintenance and updating of the imaging programs in the central databases of diagnostics centers and in order to guarantee an equal quality of imaging for as many magnetic resonance apparatuses as possible, the same imaging programs will be used within groups that include the magnetic resonance apparatuses with a similar configuration. Individual programs should only be used for specific applications.

Computer-supported methods for editing imaging programs take account of the configuration of the directly functionally linked magnetic resonance apparatus. By contrast editors that are not assigned to a specific magnetic resonance apparatus use predefined standard configurations, which should be valid for a specific group of magnetic resonance apparatuses. Thus a predefined configuration will be used as a representative of all configurations of this group. In detail, however, there can be differences between the configurations within the group, which adversely affect the usability and validity within the group, or can even prevent it. This is often not known to a user during editing. This can mean that imaging programs that do not function on all magnetic resonance apparatuses within the group are inadvertently created. The functional capability for all magnetic resonance apparatuses of a group will be even more adversely affected if the representative configuration represents the best configuration of the group in each case.

SUMMARY OF THE INVENTION

An object of the present invention is to provide a computer-supported method for processing an examination step, in particular for diagnostics centers with a number of magnetic resonance apparatuses, with which, in a predictable manner, the processed examination step is proven to work and be compatible for specific configurations.

Consequently, in accordance with the invention, in a method of the type specified at the outset, the editor is functionally linked to a selection processor, and the selection processor is supplied with different configuration files, which describe different configurations of magnetic resonance apparatuses. After a selection made by an operator from the different configuration files, the selection being made via a user interface of the editor, this selection will be supplied as the selected configuration file to the editor. After all changes to the examination step have been made, so that the changed examination step is able to run on a magnetic resonance apparatus in accordance with the selected configuration, the changed examination step is made available in electronic form by the editor.

The starting point of the invention is that, in the known methods for processing an examination step, there is no support for preventing an inadvertent specialization of examination steps. Previously, not until a centrally changed examination step is being used on an individually configured magnetic resonance apparatus, can it be recognized that such a step is either not usable or would have to be converted beforehand. Conversion is generally to be understood as a process in which the magnetic resonance apparatus automatically attempts to make an examination step that is not able to be used directly by this magnetic resonance apparatus suitable. The object of the conversion is to retain the original parameter values as far as possible. There can be numerous reasons for a conversion, e.g. when the examination step requires a configuration with licenses and/or options, which is not present on the current magnetic resonance apparatus. If e.g. an examination step was created on a magnetic resonance apparatus with many reception channels and these will also be used for imaging, under some circumstances many parameters will be changed during a conversion to a system with few reception channels. For example a parallel imaging can then no longer be carried out, which for example can greatly extend the measuring time.

Since with specialized examination steps a conversion can change many parameters, this can lead to undesired post-processing.

A significant aspect of the invention is to no longer use a fixed, predefined standard configuration for the editing, but to explicitly select a specific configuration. Thus an examination step for a group of magnetic resonance apparatuses with similar configurations will no longer be edited as conventionally, with a fixed predetermined configuration, but instead will be edited explicitly with a selected suitable configuration, in order to insure a desired compatibility. For example a group of magnetic resonance apparatuses can have a configuration with a different number of reception channels, such as 8, 18 or 64 reception channels. In order to process an examination step, a user can then select the configuration 8 "reception channels." It is then highly probable that an examination step changed under this condition will be able to run on all magnetic resonance apparatuses of this group, i.e. also on magnetic resonance apparatuses with 18 or 64 reception channels. Thus the editing of examination steps for magnetic resonance apparatuses with similar configurations will be supported, or these configurations will also be included in any change. An advantage is in the improved efficiency that is achieved for the maintenance of large databases for examination steps. Furthermore, undesired conversions will be avoided, which prevents the risk of unwanted discrepancies during imaging. The selection and setting of the configuration to be used prevent, at the very beginning, undesired examination steps from arising.

In an advantageous embodiment of the computer-supported method, at least one of the configuration files is defined for different examination steps. For example, a configuration file can involve all different examination steps for the "head" examination region. The result achieved with this type of global configuration file is that all examination steps developed and changed with it, despite different configurations, are capable of running on all magnetic resonance apparatuses of a diagnostics center.

In a further embodiment of the computer-supported method, at least one of the configuration files is defined for a number of different configurations of magnetic resonance apparatuses. For example a configuration file can apply to a group of 1.5 Tesla magnetic resonance apparatuses. The result achieved by such a global configuration file is that all examination steps developed and changed with it, despite different configurations, are capable of running on all 1.5 Tesla magnetic resonance apparatuses of a diagnostics center.

In a further embodiment of the computer-supported method, a check is made after an examination step is changed as to whether this change is also compatible with the other configurations as well as with the selected configuration. Thus an automatic check is made at suitable points as to whether the changed examination step is also valid for other configurations, i.e. is capable of running on magnetic resonance apparatuses with other configurations. The check can be made for each individual change or only once all changes have been completed.

BRIEF DESCRIPTION OF THE DRAWINGS

FIG. 1 shows an arrangement of a number of magnetic resonance apparatuses linked to a central database.

FIG. 2 shows an editor with a selection option for a specific configuration of the magnetic resonance apparatuses for processing an examination step in accordance with the invention.

DESCRIPTION OF THE PREFERRED EMBODIMENTS

FIG. 1, in an overview diagram, show the example of three diagnostic magnetic resonance apparatuses 2, 4, 6 installed at different locations of a larger chain of clinics. The use of three such apparatuses is, as noted, only an example. A larger number of such devices may not be present.

Each magnetic resonance apparatus 2, 4, 6 has an MR data acquisition scanner 8. Each scanner 8 contains, as is known, a basic field magnet that provides a basic magnetic field, gradient coils for spatially encoding MR signals, and radio-frequency coils for excitation of nuclear spins and for reception of the resulting MR signals, as well as further hardware components. Each scanner 8 is controlled by a control computer 10. The control computer 10 has a system processor and an imaging processor with associated data memories, and a user interface, which is linked to the system processor and the imaging processor, and control software. In addition the control computer 10 includes a pulse sequence controller and a gradient pulse shape generator. The user interface includes an input unit 14 and a monitor 16. The positioning of the patient and the operation of the gradient and radio-frequency coils will be predetermined by an imaging program, which generally has a number of examination steps, executed by the system processor, together with the pulse sequence controller and the gradient pulse shape generator.

The control computers 10 of the respective magnetic resonance apparatuses 2, 4, 6 are connected to one another and to a central database 20 via a data network 12. Stored in the central database 20 are imaging programs configured for magnetic resonance imaging, which are proven and released. In addition a standalone interface 22 is also connected to the data network 12.

In general imaging programs can be exchanged between a number of magnetic resonance apparatuses 2, 4, 6 manually by an import/export functionality, for example via a USB interface or via an Intranet. During import, a check will be made as to whether the imaging program is valid at the corresponding magnetic resonance apparatus. Should it not be directly compatible, a conversion may be undertaken if necessary. Because of the problems during conversion explained above, it is important for an import to function, where possible, without these conversion effects.

The standalone interface 22 is autonomous and is not assigned to any specific magnetic resonance apparatus 2, 4, 6. Like the control computers 10 however, it has access to the central database 20. The standalone interface 22 is intended here to change examination steps centrally and without direct reference to a specific magnetic resonance apparatus 2, 4, 6, via an editor, as is described in greater detail below.

Basically it should be insured that, for any given exchange of imaging programs between different magnetic resonance apparatuses 2, 4, 6, the imaging programs with the examination steps where possible only need the configuration with the characteristics and options that are present at the relevant magnetic resonance apparatuses 2, 4, 6.

In the following explanation, the magnetic resonance apparatus 2 is used to stand for a first group of a number of magnetic resonance apparatuses, which are similarly configured. This is described in a first configuration file. For example the first configuration file designates all magnetic resonance apparatuses with a basic magnetic field of 1.5 Tesla.

The magnetic resonance apparatus 4 is used to stand for a second group of a number of magnetic resonance apparatuses, which are likewise similarly configured. This is described in a second configuration file. For example the second configuration file designates all magnetic resonance apparatuses with a high-power gradient system.

The magnetic resonance apparatus 6 is used to stand for a third group of a number of magnetic resonance apparatuses, which are similarly configured. This is described in a third configuration file. For example the third configuration file designates all magnetic resonance apparatuses with an 8-channel reception arrangement.

In addition, hierarchically-organized groups of magnetic resonance apparatuses can also be defined. Thus, in addition a further group can include all magnetic resonance apparatuses with an 18-channel reception arrangement. Another group includes all magnetic resonance apparatuses with a 64-channel reception arrangement.

Furthermore there are configuration files, which, for example, are valid for imaging programs constructed hierarchically in accordance with anatomy. The topmost level of the hierarchy, for example, forms the region to be imaged or to be examined, e.g. head, heart, back, knee, etc.

A level below this makes available different examinations for the regions. Examples for the level below the regions are Standard, Routine, Library etc. The operator or user can also organize the levels in any given way, in the same way as with the known Windows File Explorer.

Arranged below this is an imaging program level. For the head region, for example, General, Lesion, Trauma, Epilepsy etc. are available, and for the heart region, for example, Morphology, Function, Dynamic etc. are available. Finally, at the lowest level, is the examination step with the pulse sequences and the parameters that can be set for them. For this purpose, further configuration files can be provided, which need not be presented further herein, for clarity.

It should be noted that there can be overlaps within the individual groups of magnetic resonance apparatuses. For example, a specific magnetic resonance apparatus can belong both to the group with a basic magnetic field of 1.5 Tesla and to the group with an 8-channel reception arrangement.

FIG. 2 shows the basic structure of a method for changing examination steps. A program editor 30 forms the core of the method, with which, in a known way, parameters of examination steps can be changed. The parameters, as already described above, allow the imaging characteristics of the examination step to be changed.

From a number of different examination steps 32.1, 32.2, 32.3, etc., in a selection step 34 in accordance with the invention, an operator selects an examination step 36 that he or she would like to change. The examination steps 32.1, 32.2, 32.3, etc. are stored in the central database 20. The selected examination step 36 will be supplied to the editor 30 for processing.

The operator selects via the examination step 38, from a collection of the different installed configurations 40.1, 40.2, 40.3 etc. or 41.1, 41.2, etc., one configuration as the selected configuration 42, for which the intended changes should be suitable. The configurations 40.1, 40.2, 40.3, etc., specify the technical structure and the execution of components of the magnetic resonance apparatuses. The configurations 41.1, 41.2 etc. are more or less hierarchically structured in accordance with the type of anatomy and examination or imaging, as described above.

In general, the goal of an operator will be to achieve that a changed examination step is capable of running on as many differently configured magnetic resonance apparatuses as possible. This can be insured by the selected configuration 42 imposing the fewest possible technical demands on the components of the magnetic resonance apparatus. For example, it will be highly probable that a changed examination step, which was created for a 1.5 Tesla magnetic resonance apparatus, will also be able to run on a 3 Tesla magnetic resonance apparatus. Likewise, a changed examination step, which was developed for a normal gradient system, will also be able to run on a magnetic resonance apparatus with a high-power gradient system. Also an examination step changed for an 8-channel reception system will be able to run on an 18-channel reception system or higher. Thus a greatest possible compatibility of the changed examination step is achieved. Generally speaking, the operator will chose a configuration that imposes the fewest possible requirements on the device components and yet, despite this, makes improved imaging possible.

During the changes, the editor 30 checks automatically in a known way whether the changed parameter value in lies in a permissible range for the selected configuration 42. For this purpose the editor 30 is linked to a values file 44, in which the permitted ranges of values of all changeable parameters depending on the selected configuration 42 are contained.

After conclusion of all the changes a changed examination step 46 is produced, which is able to run on a magnetic resonance apparatus in accordance with the selected configuration 42. The charged examination step is made available in electronic form by the editor 30.

In an additional test step 48, each change and/or the changed examination step 46 overall is checked after all changes have been concluded for compatibility with other configurations 40.1, 40.2, 40.3 etc. and 41.1, 41.2 etc. The result of the checking will be presented to the operator in a table 50.

The result of the test step 48 can be presented to the operator in a different way on the monitor of the standalone interface 22. For example there can be a separate area on a display of the editor 30, which contains all alternate configurations 40.1, 40.2, 40.3 etc. and 41.1, 41.2 etc. Each of these configurations 40.1, 40.2, 40.3 etc. and 41.1, 41.2 etc. will be marked in color: green, if the examination step is usable there; red, if it not usable with this configuration; gray, if no result is available yet. If the check is made immediately after each individual change, feedback is available at a time close to the actual editing. If the checking only takes place after the conclusion of all changes, a message on compatibility is provided immediately after conclusion. In this way storage in the central database 20 of a changed examination step 48, which is not capable of running on all intended configurations, can be prevented.

The test step 48 described above can be automated and run in the background or in a separate main task started by the operator with appropriate navigation.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A computer-supported method for processing an examination step for operation of a magnetic resonance apparatus, said method comprising:

in a memory accessible by a plurality of magnetic resonance apparatuses, storing a plurality of configuration files that each contain a configuration that is usable to configure any magnetic resonance apparatus in said plurality of magnetic resonance apparatuses, for operation of that magnetic resonance apparatus, comprising parameters that can be set for obtaining image data with that magnetic resonance apparatus, and permitted ranges of values of said parameters;

via an interface in communication with a processor, receiving a selection entry that causes different configuration files, which describe different configurations of respective magnetic resonance apparatuses in said plurality of magnetic resonance apparatuses, to be presented at said interface, and to thereafter receive a further selection parameter that selects one of said configuration files and causes the selected configuration file to be shown at said interface;

via said interface, allowing change inputs to be made into an editor in communication with the interface and in communication with the processor that change an examination step in the selected configuration file in order to make a chance in the configuration of one magnetic resonance apparatus in said plurality of magnetic resonance apparatuses, and, in response to those changed inputs, creating a changed examination step in said editor and making a check with said editor to ensure that said change in the configuration of said one magnetic resonance apparatus does not preclude the changed examination step from also configuring other magnetic resonance apparatuses in said plurality of magnetic resonance apparatuses; and making the changed examination step available via said interface from said editor to said memory.

2. A method as claimed in claim 1 wherein at least one of said configuration files is defined for a plurality of different examination steps.

3. A method as claimed in claim 1 wherein at least one of said configuration files is defined for a plurality of configurations of magnetic resonance apparatuses.

4. A method as claimed in claim 1 wherein at least one of said configuration files defines a standard configuration.

5. A method as claimed in claim 1 comprising implementing said check for each intermediate change made during the editing by said editor.

6. A method as claimed in claim 5 comprising making said check upon conclusion of editing by said editor.

* * * * *